United States Patent [19]

Okubo

[11] Patent Number: 5,583,470
[45] Date of Patent: Dec. 10, 1996

[54] LAMINATED INDUCTOR ARRAY COMPRISING A CROSSTALK INHIBITING LAYER

[75] Inventor: Akira Okubo, Nagaokakyo, Japan

[73] Assignee: Murata Manufacturing Co. Ltd., Nagaokakyo, Japan

[21] Appl. No.: 266,554

[22] Filed: Jun. 28, 1994

[30] Foreign Application Priority Data

Jul. 2, 1993 [JP] Japan .................................. 5-164871

[51] Int. Cl.⁶ ..................................................... H03H 7/01
[52] U.S. Cl. .......................................... 333/185; 336/200
[58] Field of Search ............................. 333/167, 177, 333/181, 185; 336/200, 232, 205

[56] References Cited

U.S. PATENT DOCUMENTS

| | | | |
|---|---|---|---|
| 4,904,967 | 2/1990 | Morii et al. | 333/185 |
| 4,918,417 | 4/1990 | Sakamoto | 336/200 X |
| 5,197,170 | 3/1993 | Senda et al. | 333/185 X |
| 5,225,969 | 7/1993 | Takaya et al. | 333/185 X |

FOREIGN PATENT DOCUMENTS

| | | | |
|---|---|---|---|
| 0207707 | 7/1992 | Japan | 333/177 |
| 0145364 | 6/1993 | Japan | 333/177 |
| 0347215 | 12/1993 | Japan | 336/200 |

*Primary Examiner*—Benny Lee
*Assistant Examiner*—Justin P. Bettendorf
*Attorney, Agent, or Firm*—Burns, Doane, Swecker & Mathis, LLP

[57] ABSTRACT

An inductor array used for an electronic circuit. The inductor array has two magnetic sections, each of which contains a plurality of inductor elements, and an insulating section which is disposed between the magnetic sections. The insulating section inhibits crosstalk between the inductor elements in one magnetic section and those in the other magnetic section. Further, by making the insulating section of a dielectric material and providing capacitor elements in the insulating section, an LC composite array can be obtained.

7 Claims, 7 Drawing Sheets

LAMINATED INDUCTOR ARRAY COMPRISING A CROSSTALK INHIBITING LAYER

BACKGROUND OF THE INVENTION

1. Field of the Invention

The present invention relates to an inductor device to be employed in an electronic circuit, and more particularly to an inductor array comprising a plurality of inductor elements.

2. Description of Prior Art

In an inductor array which has a plurality of inductor elements in a magnetic body, crosstalk between adjacent inductor elements caused by their mutual magnetic coupling has been a big problem. For downsizing of the inductor array, external electrodes and inductor elements have to be arranged at a small pitch, and accordingly, the crosstalk occurring among the inductor elements becomes larger. Also, for an increase in the impedance, a magnetic body with a higher magnetic permeability has to be used, and thereby, the crosstalk occurring among the inductor elements becomes larger.

SUMMARY OF THE INVENTION

An object of the present invention is to provide an inductor array which has such a structure as to inhibit crosstalk between adjacent inductor elements.

In order to attain the object, an inductor array according to the present invention comprises a first magnetic section containing a plurality of inductor elements, a second magnetic section containing a plurality of inductor elements, and an insulating section which is disposed between the first and second magnetic sections to inhibit crosstalk between the inductor elements in the first magnetic section and the inductor elements in the second magnetic section.

In the structure, since the insulating section with a low magnetic permeability is between the magnetic sections, the influence of magnetic fluxes which are generated by the inductor elements in each magnetic section on the other magnetic section is weakened by the insulating section, and the magnetic coupling between the inductor elements in the first magnetic section and those in the second magnetic section can be weakened.

Further, by making the insulating section of a dielectric material and providing capacitor elements in the insulating section, an LC composite array used as a noise filter or the like can be obtained.

BRIEF DESCRIPTION OF THE DRAWINGS

This and other objects and features of the present invention will be apparent from the following description with reference to the accompanying drawings, in which.

DETAILED DESCRIPTION OF THE PREFERRED EMBODIMENTS

Preferred embodiments of the present invention are described with reference to the accompanying drawings. In the embodiments, the same members and sections are provided with the same reference symbols.

First Embodiment: FIGS. 1–12

Figure 1:
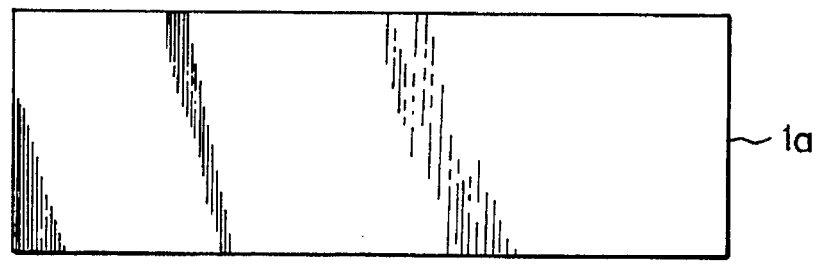
FIGS. 1, 2, 3, 4, 5, 6, 7, 8 and 9 are plan views of base sheets for an inductor array which is a first embodiment of the present invention.
Figure 2:
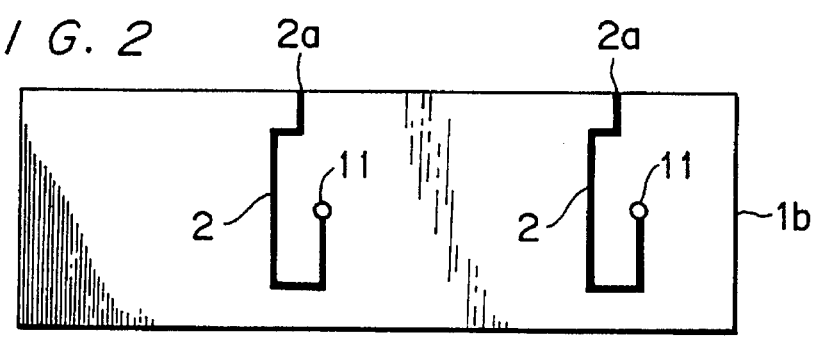
Figure 3:
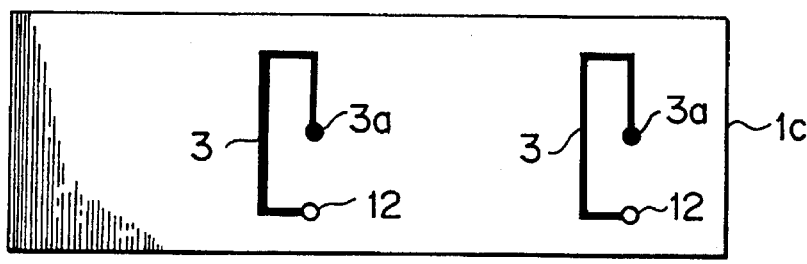
Figure 4:
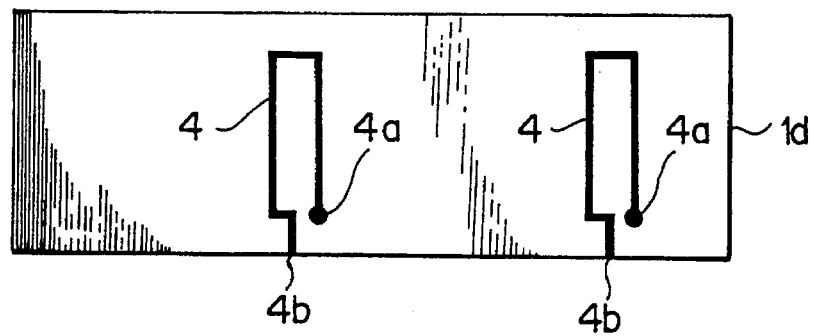

FIGS. 1 through 9 show base sheets which form an inductor array of a first embodiment. FIG. 1 shows a magnetic sheet $1a$ with no conductors thereon, and this magnetic sheet $1a$ serves as a protection sheet. FIG. 2 shows a magnetic sheet $1b$ with two identical coil conductors 2 on one side. One end $2a$ of each conductor 2 reaches an edge of the magnetic sheet $1b$, and the other end becomes a via hole 11. FIG. 3 shows a magnetic sheet $1c$ with two identical coil conductors 3 on one side. One end of each conductor 3 becomes a via hole 12, and the other end becomes a contact pad $3a$. FIG. 4 shows a magnetic sheet $1d$ with two identical coil conductors 4. One end of each conductor 4 becomes a contact pad $4a$, and the other end $4b$ reaches an edge of the magnetic sheet $1d$.

Figure 5:
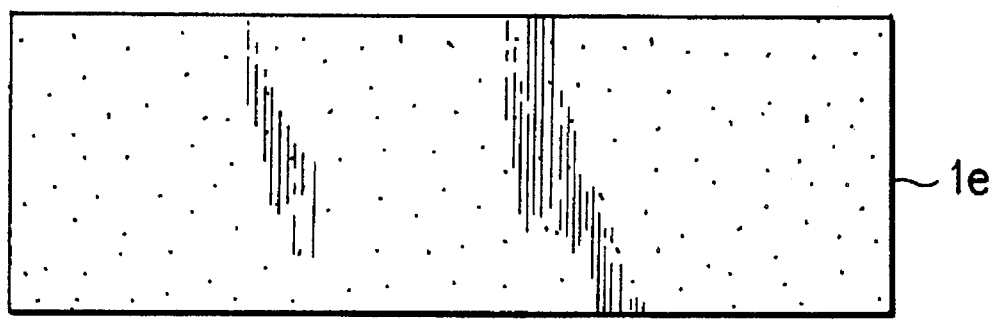
Figure 6:
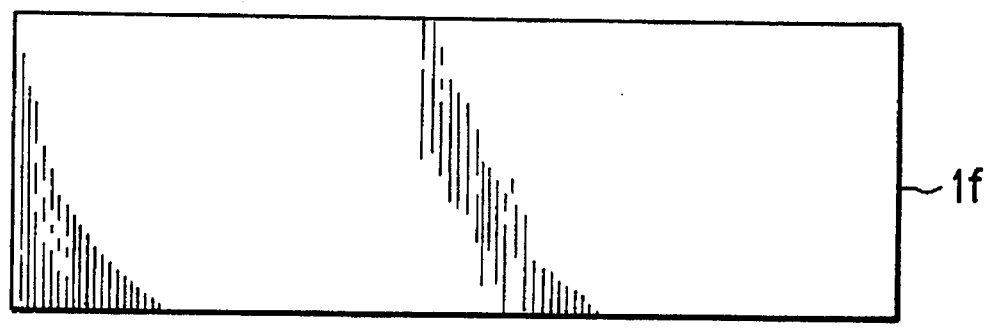
Figure 7:
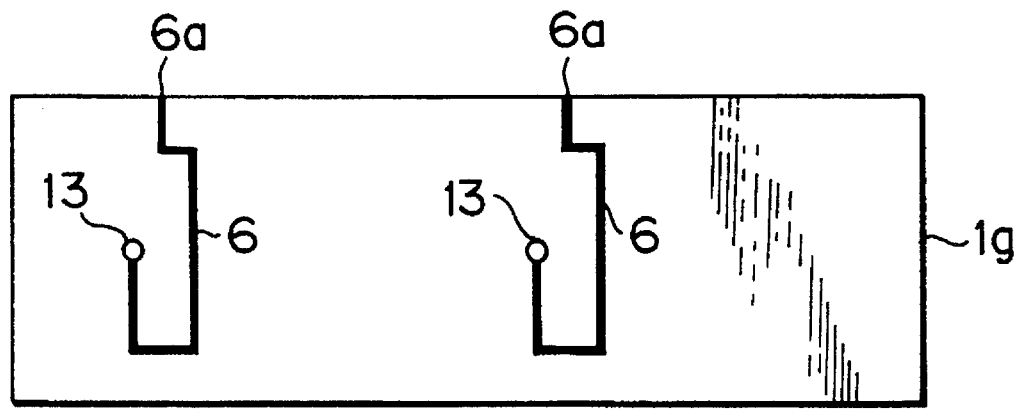
Figure 8:
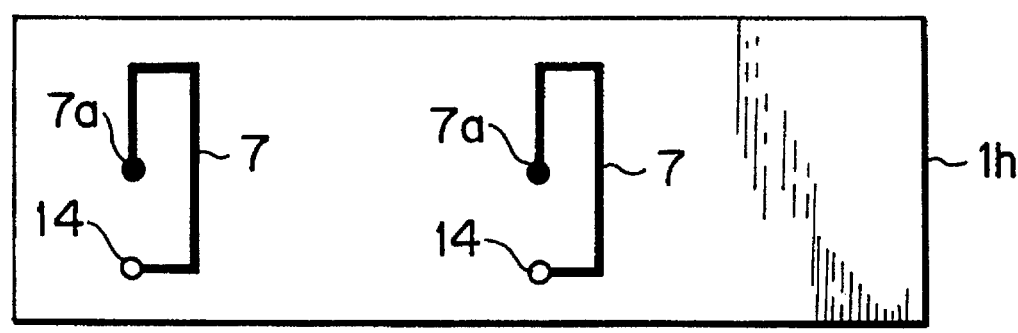
Figure 9:
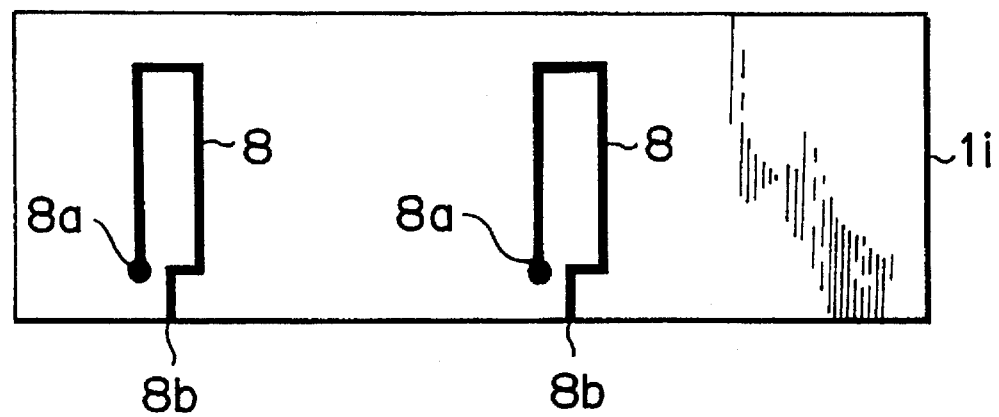

FIG. 5 shows an insulating sheet $1e$ with no conductors thereon. FIG. 6 shows a magnetic sheet $1f$ with no conductors thereon. FIG. 7 shows a magnetic sheet $1g$ with two identical coil conductors 6 on one side. One end $6a$ of each conductor 6 reaches an edge of the magnetic sheet $1g$, and the other end becomes a via hole 13. FIG. 8 shows a magnetic sheet $1h$ with two identical coil conductors 7 on one side. One end of each conductor 7 becomes a via hole 14, and the other end becomes a contact pad $7a$. FIG. 9 shows a magnetic sheet $1i$ with two identical coil conductors 8 on one side. One end of each conductor 8 becomes a contact pad $8a$, and the other end $8b$ reaches an edge of the magnetic sheet $1i$.

Figure 10:
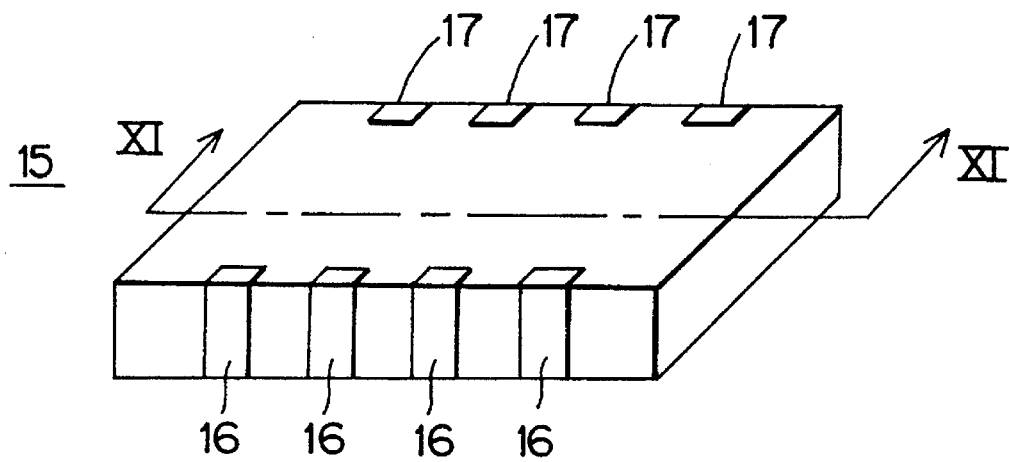
FIG. 10 is a perspective view of the inductor array of the first embodiment.
Figure 11:
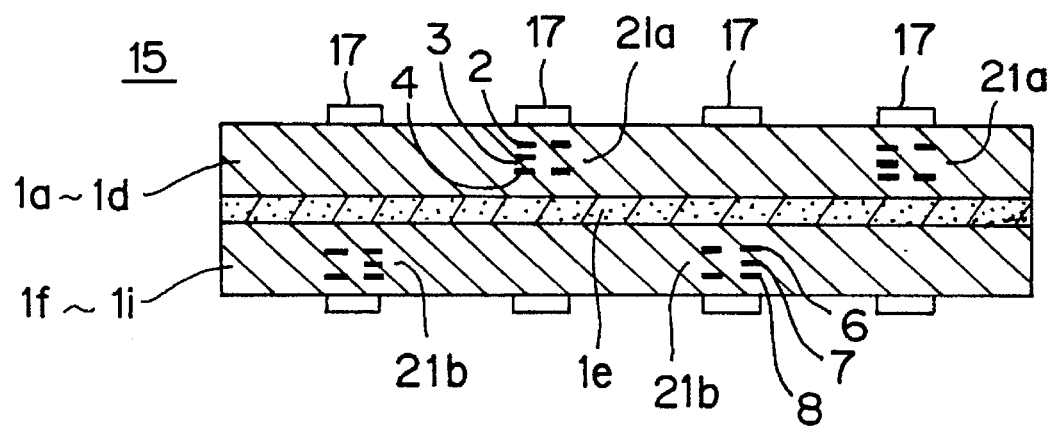
FIG. 11 is a sectional view of the inductor array, taken along a line XI—XI indicated in FIG. 10.

The sheets $1a$ through $1i$ are laminated such that the sheet $1i$ is at the bottom, that the sheet $1g$ is placed on the sheet $1i$, that the sheet $1h$ is placed on the sheet $1i$,— and that the sheet $1a$ is at the top. These laminated sheets $1a$ through $1i$ are compression-bonded and sintered. Thus, an inductor array 15 as shown by FIG. 10 and 11 is fabricated. The inductor array 15 is provided with input electrodes 16 on the front edge and with output electrode 17 on the rear edge. The coil conductors 2 and 6 are connected with the output electrodes, and the coil conductors 4 and 8 are connected with the input electrodes 16.

Figure 12:
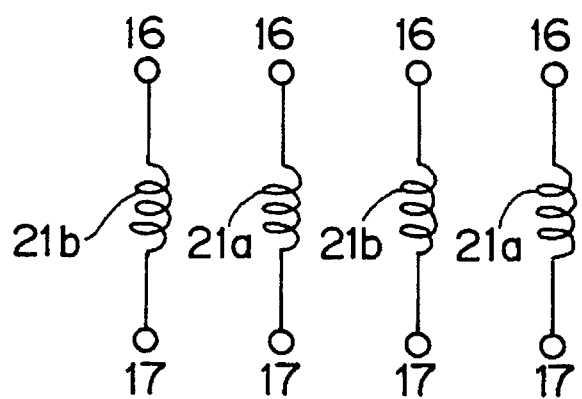
FIG. 12 is an electrical equivalent circuit of the inductor array shown in FIG. 10.

In the laminate structure, the insulating sheet $1e$ is between an upper magnetic section composed of the magnetic sheets $1a$ through $1d$ and a lower magnetic section composed of the magnetic sheets if through $1i$. In the upper magnetic section, the coil conductors 2, 3 and 4 are serially connected through the via holes 11 and 12, and thus, inductor elements $21a$ are formed. In the lower magnetic section, the coil conductors 6, 7 and 8 are serially connected through the via holes 13 and 14, and thus, inductor elements 21b are formed. The inductor elements 21a and 21b are staggered in the direction of the thickness of the inductor array 15 with the insulating sheet 1e in-between. FIG. 12 shows the electric equivalent circuit of the inductor array 15.

In the inductor array 15 of the above structure, since the insulating sheet 1e with a low magnetic permeability is between adjacent inductor elements 21a and 21b, magnetic fluxes generated by the inductor elements 21a and 21b are weakened by the insulating sheet 1e, and the magnetic coupling therebetween can be weakened. Consequently, in the inductor array 15, the crosstalk between adjacent inductor elements 21a and 21b can be inhibited.

Second Embodiment; FIGS. 13 through 20

A second embodiment is an inductor array which has an insulting section made of a dielectric material and capacitor elements in the insulating section. The second embodiment has the same magnetic sections as the first embodiment, and the description of the magnetic sections is omitted.

Figure 13:
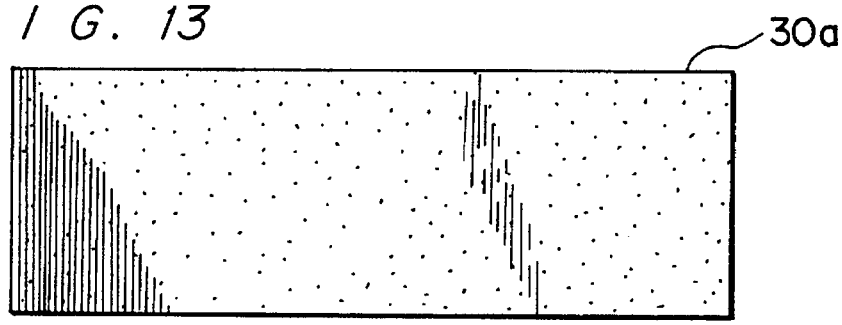
FIG. 13, 14, 15 and 16 are plan views of base sheets for an inductor array which is a second embodiment.
Figure 14:
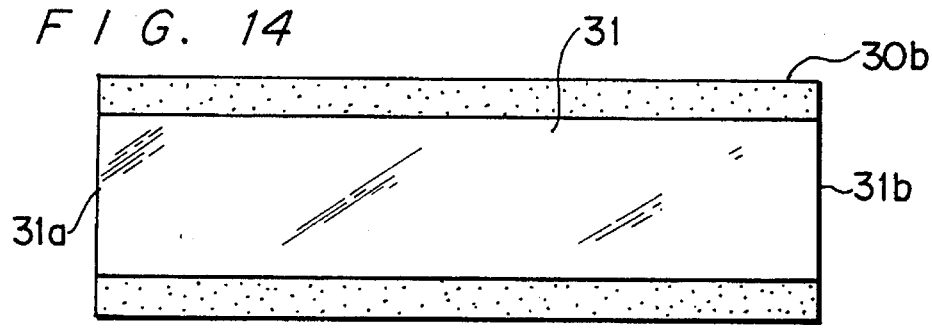
Figure 15:
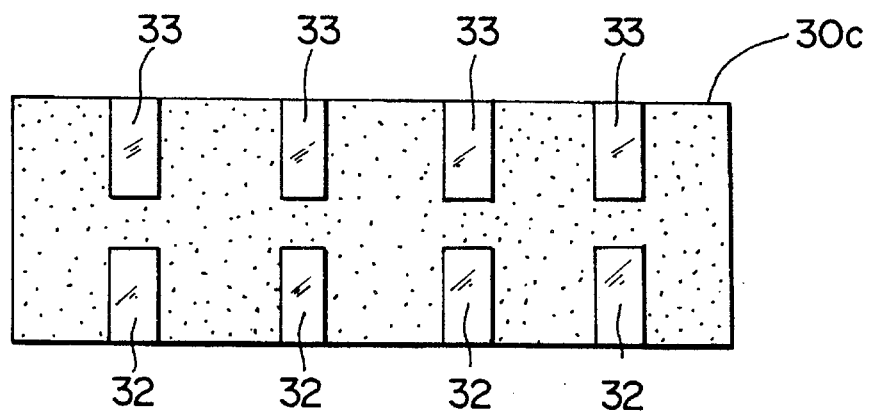
Figure 16:
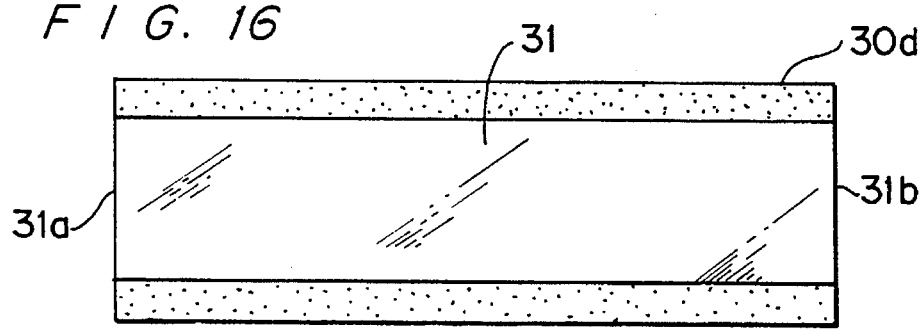

FIGS. 13 through 16 show base sheets which form the insulating section. FIG. 13 shows a dielectric sheet 30a with no conductors thereon. FIG. 14 shows a dielectric sheet 30b with an internal grounding conductor 31 on one side. The right end 31b and the left end 31a of the internal grounding conductor 31 reach right and left edges of the dielectric sheet 30b. A dielectric sheet 30d shown by FIG. 16 has an internal grounding conductor 31 of the same shape. FIG. 15 shows a dielectric sheet 30c with internal signal conductors 32 and 33 on one side. The internal signal conductors 32 and 33 are opposite each other.

Figure 17:
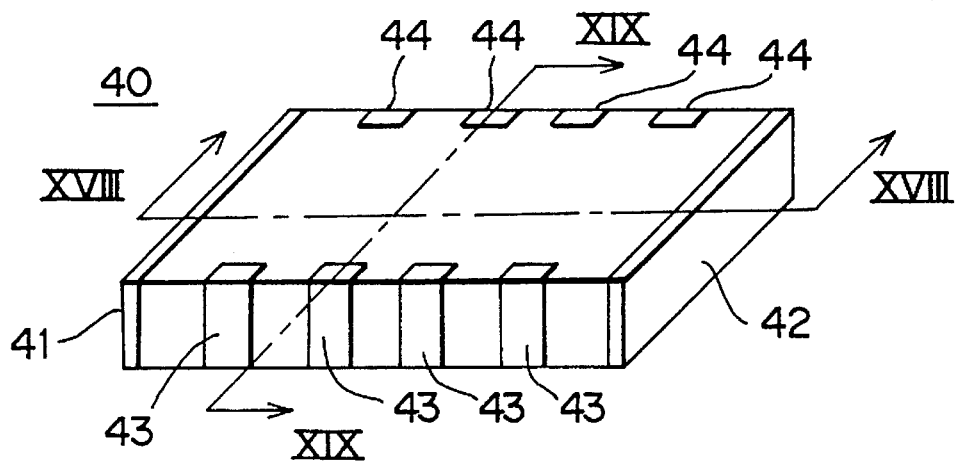
FIG. 17 is a perspective view of the inductor array of the second embodiment.
Figure 18:
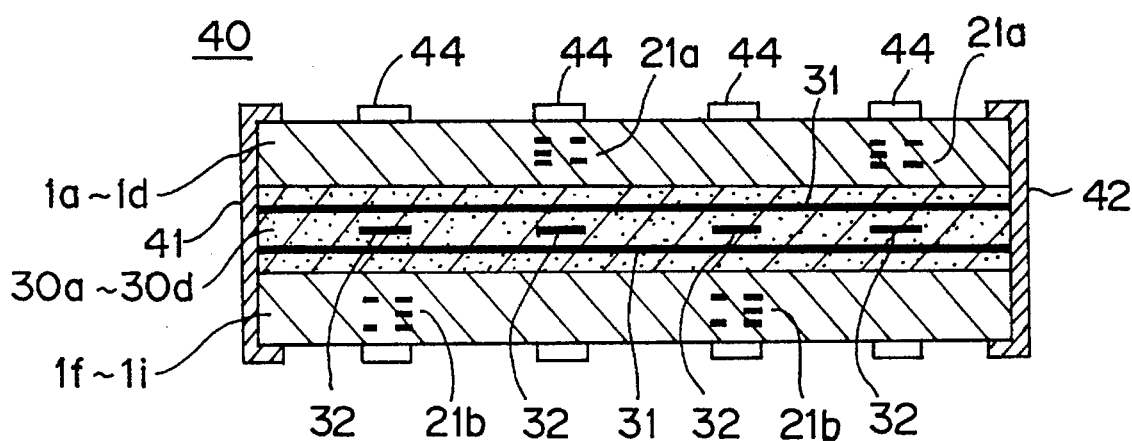
FIG. 18 is a sectional view of the inductor array, taken along a line XVIII—XVIII indicated in FIG. 17.
Figure 19:
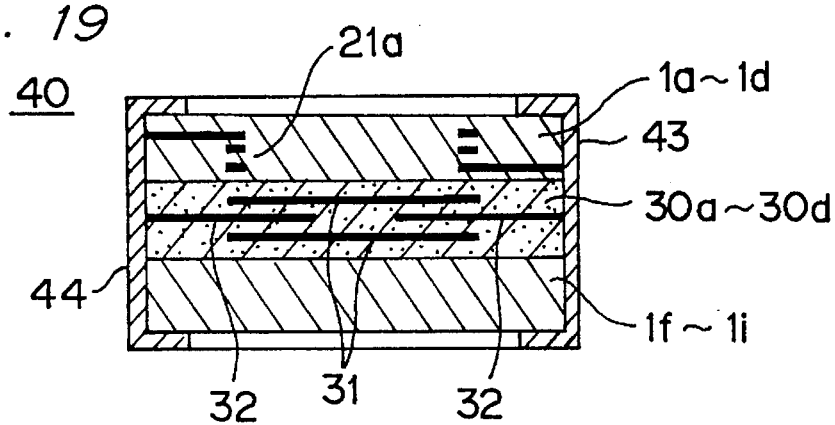
FIG. 19 is a sectional view of the inductor array, taken along a line XIX—XIX indicated in FIG. 17.

The sheets 30a through 30d are laminated such that the sheet 30d is at the bottom, that the sheet 30c and then the sheet 30b are placed on the sheet 30d and that the sheet 30a is at the top. Thus, a dielectric section is formed. Then, the dielectric section is placed between the magnetic sections, and these sections are compression-bonded and sintered. In this way, an inductor array 40 as shown by FIGS. 17 through 19 are fabricated. On the right and left edges of the inductor array 40, external grounding electrodes 42 and 41 are provided. On the front edge and on the rear edge of the inductor array 40, input electrodes 43 and output electrode 44 are provided respectively. Each of the inductor elements 21a or 21b is in contact with the input electrode 43 at one end and is in contact with the output electrode 44 at the other end. The internal signal electrodes 32 are connected with the input electrode 43 and the internal signal electrodes 33 are connected with the output electrode 44. Each of the internal grounding conductors 31 is in contact with the external grounding electrodes 42 and 41 at the right and left ends.

Figure 20:
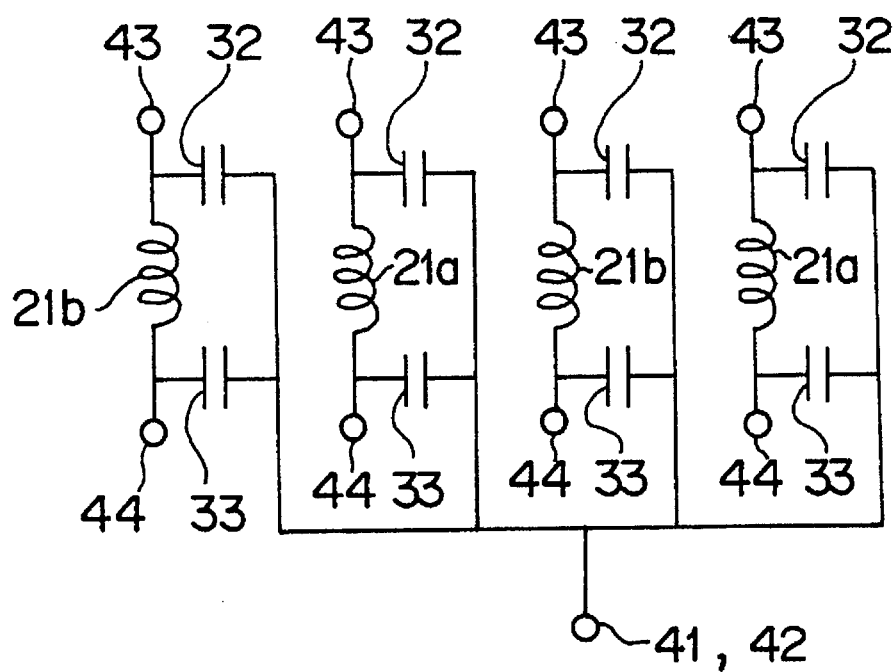
FIG. 20 is an electrical equivalent circuit of the inductor array shown in FIG. 17.

In the laminate structure, the internal signal conductors 32 and the internal grounding conductors 31 form capacitors. The inductor elements 21a formed in the upper magnetic section and the inductor elements 21b formed in the lower magnetic section are separated by the insulating section composed of the dielectric sheets 30a through 30d. FIG. 20 shows the electric equivalent circuit of the inductor array 40. The inductor array 40 contains four π type LC elements.

The inductor array 40 of the above structure has the same action and effect as described in connection with the inductor array 15 of the first embodiment. Moreover, the inductor array 40 is an LC composite array which can be used as a noise filter or the like.

Other Embodiments

Although the inductor elements of the above embodiments are of a spiral type, they may be other types such as a linear type.

Both of the above embodiments have a single insulating section. However, an inductor array may have two or more insulating sections and have more layers.

The inductor array of the second embodiment contains π type elements. However, the inductor array can be made so as to contain L type or T type elements. Also, the inductor array can be made so as to contain any number of elements.

In the above embodiments, the inductor elements in the respective magnetic sections are positioned such that the inductor elements in the upper magnetic section and those in the lower magnetic section are staggered in the direction of the thickness of the inductor array. However, this positioning is not always necessary, and the inductor elements may be positioned such that the inductor elements in the upper magnetic section will be right above those in the lower magnetic section with the insulating section in-between.

Although the present invention has been described connection with the preferred embodiments above, it is to be noted that various changes and modifications are possible to those who are skilled in the art. Such changes and modifications are to be understood as being within the scope of the present invention.

What is claimed is:

1. An inductor array having first and second opposing inductor array surfaces, first and second opposing side surfaces, and first and second opposing end surfaces, the inductor array comprising:

a first magnetic section which is a laminate of first magnetic sheets and first coil conductors, the first coil conductors being electrically connected to form a plurality of spiral type first inductor elements which are independent of each other and arranged side by side in a direction traversing the first and second end surfaces;

a second magnetic section which is a laminate of second magnetic sheets and second coil conductors, the second coil conductors being electrically connected to form a plurality of spiral type second inductor elements which are independent of each other and arranged side by side in the direction traversing the first and second end surfaces;

an insulating section which is disposed between the first and second magnetic sections, the insulating section further comprising a material having a magnetic permeability which is lower than that of the first and second magnetic sheets to perform a function of inhibiting crosstalk between the first inductor elements in the first magnetic section and the second inductor elements in the second magnetic section, the insulating section containing no conductor elements therein;

a plurality of first outer electrodes which are provided on the first side surface at specific intervals, the first and second inductor elements being electrically connected to the first outer electrodes; and a plurality of second outer electrodes which are provided on the second side surface at specific intervals, the first and second inductor elements being electrically connected to the second outer electrodes.

2. An inductor array as claimed in claim 1, wherein the first inductor elements in the first magnetic section and the second inductor elements in the second magnetic section are staggered in a direction traversing said first and second inductor array surfaces.

3. An inductor array as claimed in claim 1, wherein the first inductor elements in the first magnetic section are opposite the second inductor elements in the second magnetic section in a direction traversing the first and second inductor array surfaces.

4. An inductor array having first and second opposing inductor array surfaces, first and second opposing side surfaces, and first and second opposing end surfaces, the inductor array comprising:

a first magnetic section which is a laminate of first magnetic sheets and first coil conductors, the first coil conductors being electrically connected to form a plurality of spiral type first inductor elements which are independent of each other and arranged side by side in a direction traversing the first and second end surfaces;

a second magnetic section which is a laminate of second magnetic sheets and second coil conductors, the second coil conductors being electrically connected to form a plurality of spiral type second inductor elements which are independent of each other and arranged side by side in the duration traversing the first and second end surfaces;

an insulating section which is disposed between the first and second magnetic sections, the insulating section further comprising a dielectric material to perform a function of inhibiting crosstalk between the first inductor elements in the first magnetic section and the second inductor elements in the second magnetic section, the insulating section comprising capacitor elements which correspond to at least one of either the first inductor elements or the second inductor elements;

a plurality of first outer electrodes which are provided on the first side surface at specific intervals, the first and second inductor elements being electrically connected to the first outer electrodes; and a plurality of second outer electrodes which are provided on the second side surface at specific intervals, the first and second inductor elements being electrically connected to the second outer electrodes;

wherein the first inductor elements in the first magnetic section and the second inductor elements in the second magnetic section are staggered without overlapping in the direction traversing said first and second inductor array surfaces.

5. An inductor array as claimed in claim 4, wherein the inductor elements and the capacitor elements for $\pi$ type LC circuits.

6. An inductor array as claimed in claim 4, wherein the first and second inductor elements and the capacitor elements form L type LC circuits.

7. An inductor array as claimed in claim 4, wherein the inductor elements and the capacitor elements form T type LC circuits.

* * * * *